(12) United States Patent
Shirasu et al.

(10) Patent No.: US 7,338,905 B2
(45) Date of Patent: Mar. 4, 2008

(54) SEMICONDUCTOR DEVICE MANUFACTURE METHOD

(75) Inventors: Tetsuya Shirasu, Kawasaki (JP);
Toshiyuki Karasawa, Kawasaki (JP);
Nobuhiro Misawa, Kawasaki (JP);
Tamotsu Yamamoto, Kawasaki (JP);
Kenji Nakano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 269 days.

(21) Appl. No.: 10/838,218

(22) Filed: May 5, 2004

(65) Prior Publication Data

US 2005/0159005 A1    Jul. 21, 2005

(30) Foreign Application Priority Data

Jan. 21, 2004    (JP) .............................. 2004-013313

(51) Int. Cl.
*H01L 21/302* (2006.01)
*H01L 21/461* (2006.01)

(52) U.S. Cl. ............................... 438/692; 257/E21.244; 257/E21.304; 257/E21.58

(58) Field of Classification Search ................. 438/692
See application file for complete search history.

(56) References Cited

U.S. PATENT DOCUMENTS

2004/0084414 A1* 5/2004 Sakai et al. .................... 216/88
2004/0266185 A1* 12/2004 Doke et al. ................. 438/689

* cited by examiner

*Primary Examiner*—Alexander Ghyka
(74) *Attorney, Agent, or Firm*—Westerman, Hattori, Daniels & Adrian, LLP.

(57) ABSTRACT

An electric conductive film is formed on the insulating surface of a substrate, the substrate having a trench formed on the insulating surface, and the conductive film being filled in the trench. Chemical mechanical polishing is executed to expose the insulating surface of the substrate and leave a portion of the conductive film in the trench. The surface of the substrate having the exposed conductive film in the trench and the exposed insulating surface is exposed to first liquid. After being exposed to the first liquid, the surface of the substrate is exposed to second liquid. The first liquid is either solution which contains at least one first substance selected from a first group consisting of benzotriazole, derivative of benzotriazole and interfacial active agent, or water. The second solution is solution which contains the first substance at a density higher than a density of the first liquid.

8 Claims, 8 Drawing Sheets

SEMICONDUCTOR DEVICE MANUFACTURE METHOD

CROSS REFERENCE TO RELATED APPLICATION

This application is based on and claims priority of Japanese Patent Application No. 2004-13313 filed on Jan. 21, 2004, the entire contents of which are incorporated herein by reference.

BACKGROUND OF THE INVENTION

A) Field of the Invention

The present invention relates to a semiconductor device manufacture method, and more particularly to a method of manufacturing a semiconductor device wherein a conductive film or insulating film is formed on a substrate, this film is chemically and mechanically polished, and thereafter the polished surface is washed and cleaned.

B) Description of the Related Art

In order to realize finer patterning, recent miniaturization techniques and lithography techniques adopt a process of planarizing the surface of a semiconductor wafer to be processed. Planarizing techniques called chemical mechanical polishing (CMP) have been often applied to the planarizing processes. CMP techniques will be briefly described.

A polishing pad (polishing cloth) is fixed to a polishing platen, and slurry is supplied onto the polishing pad. A semiconductor wafer to be polished is pushed against the polishing pad to polish the semiconductor wafer while both the polishing pad and semiconductor wafer are rotated.

Slurry is added with abrasive grains (powders) mainly made of silicon oxide and various chemicals such as polishing accelerator. These abrasive grains and various chemicals often contain contaminated substances which may cause some trouble during the manufacture of semiconductor devices. In order to remove contaminated substances, washing and cleaning processes are executed after CMP. The contaminated substances often adhere to the abrasive grains and foreign matters (fine particles) that are generated during CMP. If foreign matters are left on the surface of a semiconductor wafer, these foreign matters may cause some trouble during the succeeding manufacture processes, which may become a factor of low manufacture yield. One of important objects of the washing and cleaning process is to remove abrasive grains and foreign matters left on the surface of a semiconductor wafer.

Alkali liquid is used as the washing and cleaning liquid for removing foreign matters. Acid solution is used as the washing and cleaning liquid for removing contaminated elements. Washing and cleaning liquid whose liquid performance and additive chemical liquid are adjusted is also known which is used for removing both foreign matters and contaminated elements. In order to prevent a metal film of copper or the like from being corroded during washing and cleaning, anticorrosive is added to washing and cleaning liquid and this solution is used for washing and cleaning a semiconductor wafer while the surface of a metal film is protected. Japanese Patent Laid-open Publication No. HEI-11-40526 discloses the techniques in which the surface of a semiconductor wafer after CMP is washed and cleaned with washing and cleaning liquid added with anticorrosive of benzotriazole (BTA).

Slurry which contains anticorrosive is generally used for polishing a copper layer in order to adjust a removal rate for copper and prevent corrosion of copper. Also known is slurry which does not contain anticorrosive in order to set removal rates for copper and silicon oxide near each other (refer to Japanese Patent Laid-open Publication No. 2001-196336).

Evaluation experiments made by the present inventors will be described. A silicon oxide film was formed on the surface of an eight-inch silicon wafer by plasma enhanced-chemical vapor deposition (PE-CVD). Slurry was produced by adding pure water to silicon oxide abrasive grains and adding alkaline solution (potassium hydroxide solution) to adjust its pH to 8 or higher. By using this slurry, the silicon oxide film was polished. Even after this polishing, the silicon oxide film is left on the whole surface of the silicon wafer.

After the polishing, the surface of the silicon wafer was washed and cleaned with alkali washing and cleaning liquid whose pH was adjusted to 10 or higher by adding alkali solution, anticorrosive and pure water. Thereafter, the surface of the silicon wafer was washed and cleaned by acid washing and cleaning liquid whose pH was adjusted to 5 or lower by adding organic acid. The surface of the silicon wafer was dried with a spin drier.

The attachment conditions of foreign matters on the silicon wafer surface after washing and cleaning were observed with a defect inspection apparatus. In this observation, foreign matters having a size equal to about 0.1 μm or larger are counted. Ninety thousand foreign matters existed on the silicon oxide film formed on the silicon wafer surface. It is therefore difficult to remove foreign matters sufficiently by using the conventional washing and cleaning method.

As described in the above-cited Japanese Patent Laid-open Publication No. HEI-11-40526, copper of a copper wiring layer formed by a damascene method can be prevented from being corroded if anticorrosive is added to washing and cleaning solution. There is no description of the foreign matter removal in this Publication.

SUMMARY OF THE INVENTION

An object of this invention is to provide a semiconductor device manufacture method capable of efficiently removing foreign matters left on a surface after CMP. Another object of this invention is to provide a semiconductor device manufacture method capable of planarizing a surface by suppressing generation of dishing and erosion.

According to one aspect of the present invention, there is provided a semiconductor device manufacture method, comprising steps of: forming an electric conductive film on an insulating surface of a substrate, the substrate having a trench formed on the insulating surface, and the conductive film being filled in the trench; executing chemical mechanical polishing to expose the insulating surface of the substrate and leave a portion of the conductive film in the trench; bringing a surface of the substrate, on which the conductive film in the trench and the insulating surface are exposed, into contact with first liquid; and bringing the surface of the substrate into contact with second liquid after being brought into contact with to the first liquid, wherein the first liquid is either solution which contains at least one first substance selected from a first group consisting of benzotriazole, derivative of benzotriazole and interfacial active agent, or water, and the second solution is solution which contains the first substance at a density higher than a density of the first liquid.

According to another aspect of the present invention, there is provided a semiconductor device manufacture method, comprising steps of: forming an insulating film made of insulating material on a surface of a semiconductor substrate; subjecting a surface layer of the insulating film to chemical mechanical polishing to planarize a surface of the insulating film in such a manner that the insulating film covers the whole surface of the semiconductor substrate even after the polishing; and bringing the planarized surface of the insulating film into contact with third liquid which contains at least one third substance selected from a third group consisting of benzotriazole, derivative of benzotriazole and interfacial active agent.

According to another aspect of the present invention, there is provided a semiconductor manufacture method, comprising steps of: forming a barrier metal layer on an insulating surface of a substrate and on an inner surface of a trench formed on the insulating surface of the substrate; forming a conductive layer made of copper or copper-containing alloy on the barrier metal layer, the conductive layer being filled in the trench; subjecting the conductive layer to chemical mechanical polishing until the barrier metal layer is exposed, by using first slurry which contains copper anticorrosive; and subjecting the barrier metal layer and a surface layer of the conductive layer in the trench to chemical mechanical polishing using second slurry which does not contain copper anticorrosive.

After the surface after polishing is exposed to the first liquid, it is exposed to the second liquid so that foreign matters left on the surface can be removed effectively. Foreign matters left on the surface can be removed effectively also by exposing the surface after polishing to the third liquid.

By polishing a conductive layer with slurry which contains anticorrosive, the removal rate can be easily controlled to a desired value. After the barrier metal layer is exposed, polishing is conducted using slurry which does not contain anticorrosive so that it is possible to suppress formation of dishing and erosion and planarize the surface.

DESCRIPTION OF THE PREFERRED EMBODIMENTS

Figure 1A:
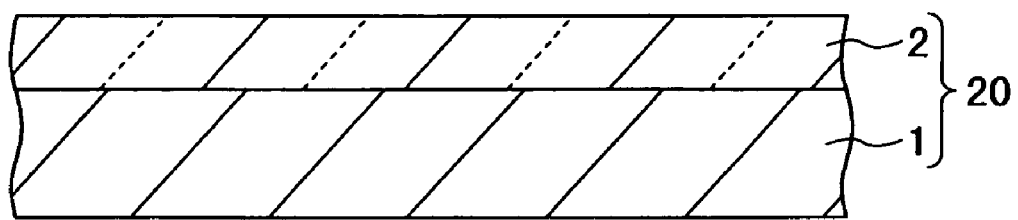
FIGS. 1A and 1B are cross sectional views of a substrate to be processed, illustrating a semiconductor device manufacture method according to a first embodiment.
Figure 1B:
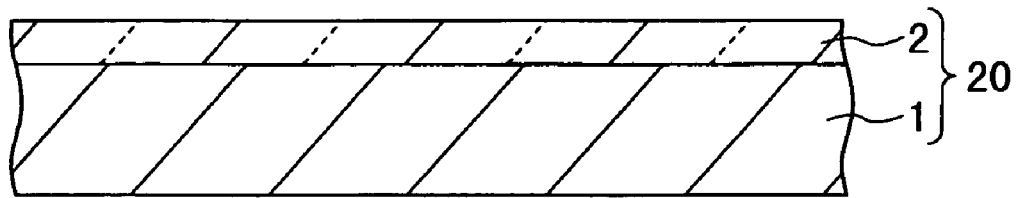
Figure 2:
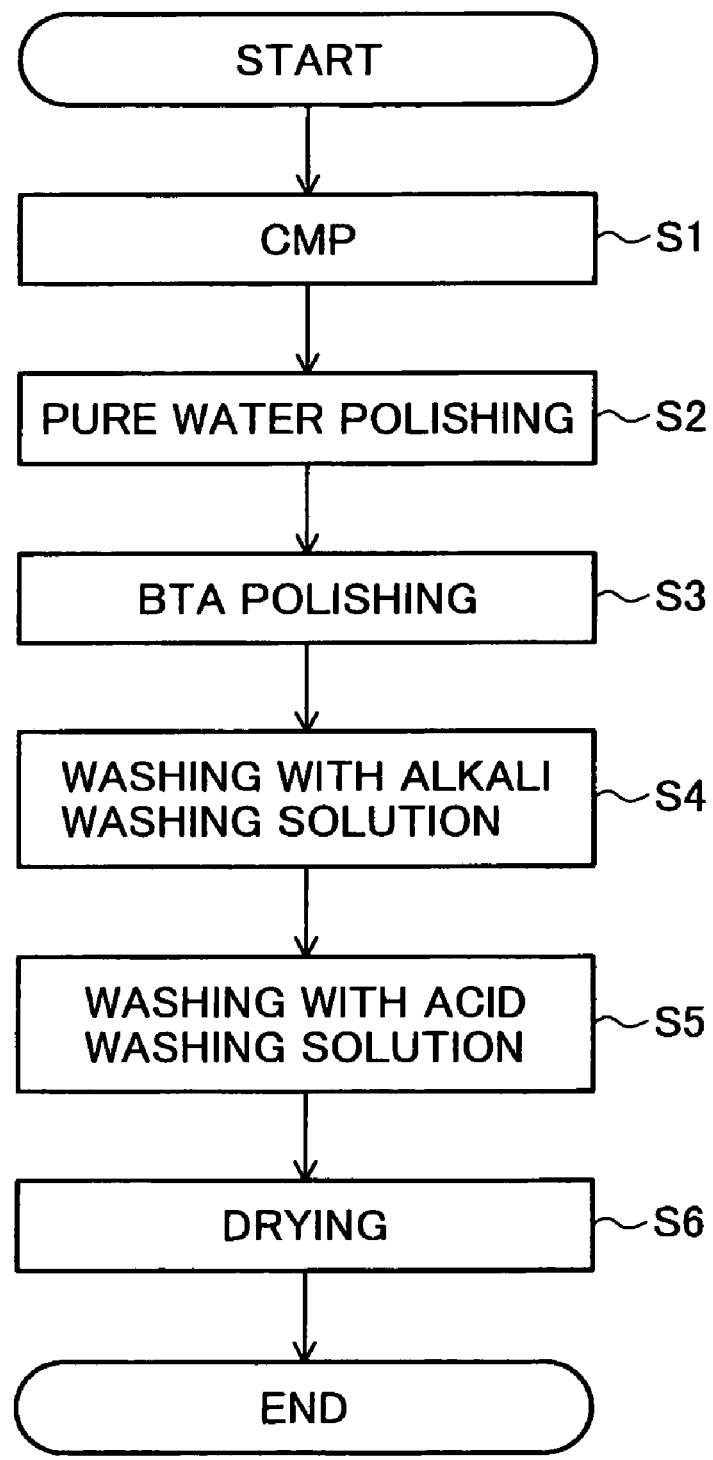
FIG. 2 is a flow chart illustrating the processes of the semiconductor device manufacture method according to the first embodiment.

With reference to FIGS. 1A to 3, description will be made on a semiconductor device manufacture method according to the first embodiment. FIGS. 1A and 1B are cross sectional views of a substrate to be processed according to the first embodiment, and FIG. 2 is a flow chart illustrating the main processes of the semiconductor device manufacture method according to the first embodiment.

As shown in FIG. 1A, on the surface of a semiconductor wafer 1 made of silicon, an insulating film 2 of silicon oxide was formed by PE-CVD to prepare a substrate 20 to be processed. An 8-inch diameter wafer was used as the semiconductor wafer 1. At Step S1 shown in FIG. 2, the insulating film 2 is subjected to chemical mechanical polishing (CMP).

Figure 3:
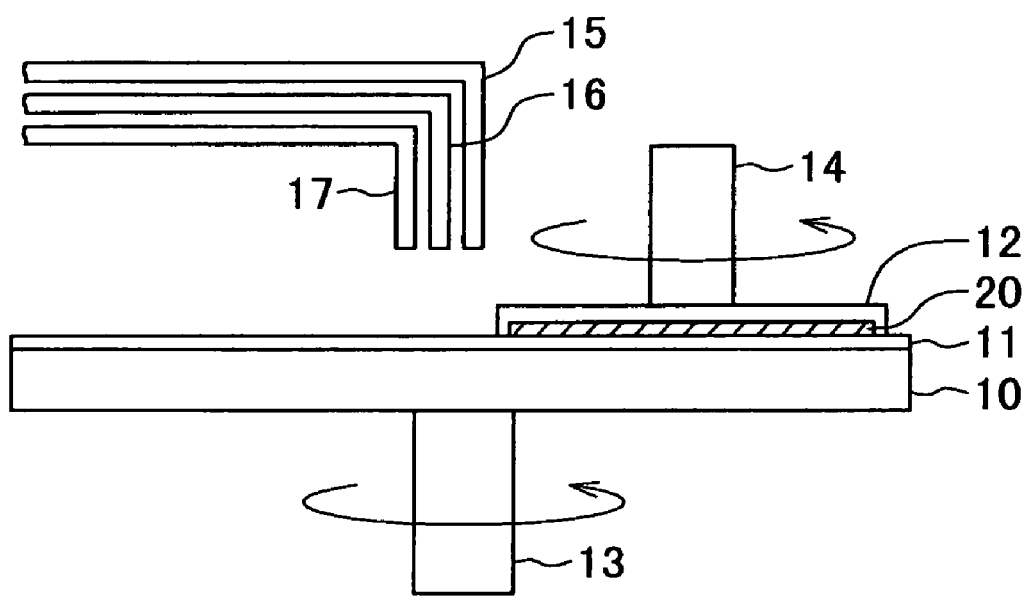
FIG. 3 is a schematic cross sectional view of a CMP apparatus used by the semiconductor device manufacture method according to the first embodiment.

FIG. 3 is a schematic diagram showing the outline of a CMP apparatus. To the upper surface of a polishing platen 10, a polishing pad 11 is fixed in tight contact therewith. The polishing platen 10 and polishing pad 11 rotate about a center of a rotating shaft 13. The substrate 20 to be processed is held by a polishing carrier 12, and the polishing surface (surface of the insulating film 2) is in contact with the polishing pad 11 at the position shifted from the center of the rotating shaft 13. The polishing carrier 12 and substrate 20 rotate about the center of a rotating shaft 14. The rotating shaft 14 of the polishing carrier 12 is disposed at the position shifted from the rotating shaft 13 of the polishing platen 10. The rotating shaft 14 reciprocally moves in some cases along the radial direction relative to the center of the rotating shaft 13 of the polishing platen 10. Slurry, pure water and benzotriazole (BTA) are supplied onto the surface of the polishing pad 11 from a slurry supply nozzle 15, a pure water supply nozzle 16 and a BTA supply nozzle 17, respectively.

During CMP at Step S1, slurry for insulating film polishing is supplied from the slurry supply nozzle 15. Slurry used contained abrasive grains of silicon oxide (silica), hydrogen peroxide, citric acid and potassium hydroxide and was adjusted to have pH of 8 or higher. CMP conditions were that a supply amount of slurry was 200 ml/min, the numbers of revolutions of the polishing platen 10 and polishing carrier 12 were 80 rpm and 76 rpm, respectively, and a pressure of pushing the substrate 20 against the polishing pad 10 was set to 20680 Pa (3 psi). Under these conditions, polishing was performed for 60 seconds. These polishing conditions are altered properly depending upon the material of an insulating film, a thickness to be polished and the like.

FIG. 1B is a cross sectional view of the substrate 20 after polishing. The surface layer of the insulating film 2 was removed and the insulating film 2 was thinned. The surface of the semiconductor wafer 1 is not exposed, but the whole surface of the semiconductor wafer 1 is covered with the thinned insulating film 2.

At next Step S2 shown in FIG. 2, pure water polishing is performed. A pure water polishing method will be described hereinunder. After the supply of slurry from the slurry supply nozzle 15 is stopped, pure water was supplied from the pure water supply nozzle 16. Pure water polishing conditions were that a supply amount of pure water was 200 ml/min, the numbers of revolutions of the polishing platen 10 and polishing carrier 12 were both 40 rpm, and a pressure of pushing the substrate 20 against the polishing pad 11 was set to 6895 Pa (1 psi). Under these conditions, polishing was performed for 10 seconds. The numbers of revolutions of the polishing platen 10 and polishing carrier 12 may be set to a range from 15 to 150 rpm.

With this polishing, slurry stayed resident between the substrate 20 and the polishing pad 11 was removed.

At next Step S3 shown in FIG. 2, BTA polishing is performed. A BTA polishing method will be described hereinunder. After the supply of pure water from the pure water supply nozzle 16 was stopped, BTA aqueous solution was supplied from the BTA supply nozzle 17. The pure water supply nozzle 16 and BTA supply nozzle 17 may be replaced with a single nozzle. The weight percentage of BTA aqueous solution was set to 0.05 wt. % and its temperature was set to 25° C. BTA polishing conditions were that a supply amount of BTA aqueous solution was 200 ml/min, the numbers of revolutions of the polishing platen 10 and polishing carrier 12 were both 40 rpm, and a pressure of pushing the substrate 20 against the polishing pad 10 was set to 6895 Pa (1 psi). Under these conditions, polishing was performed for 15 seconds. The numbers of revolutions of the polishing platen 10 and polishing carrier 12 may be set to a range from 15 to 150 rpm.

In the pure water polishing process and BTA polishing process, if the pressure of pushing the substrate 20 against the polishing pad 11, the supply amounts of water and BTA aqueous solution and the polishing period are not proper, polishing defects called scratches are formed on the surface of the substrate 20. In order to prevent the formation of scratches, it is preferable that the pressure is set to 13790 Pa (2 psi) or lower and each of the supply amounts of pure water and BTA aqueous solution is set to 100 ml/min or less. It is also preferable that the pure water polishing period is set to 10 to 20 seconds and the BTA polishing period is set to 10 to 20 seconds.

At next Step S4, the substrate 20 is washed and cleaned with alkali washing and cleaning liquid. At next Step S5, the substrate 20 is washed and cleaned with acid washing and cleaning liquid. The alkali washing and cleaning liquid is aqueous solution in which alkali liquid and anticorrosive are dissolved, and is adjusted to have pH of 10 or higher. The acid washing and cleaning liquid is aqueous solution which contains organic acid, and is adjusted to have pH of 5 or lower. At next Step S6, the substrate 20 is dried with a spin drier.

After drying, the surface of the insulating film 2 was inspected with a defect detecting apparatus and the number of foreign matters having a size of about 0.1 μm was counted. The number of foreign matters was counted almost over the whole surface of the 8-inch wafer.

Figure 4:
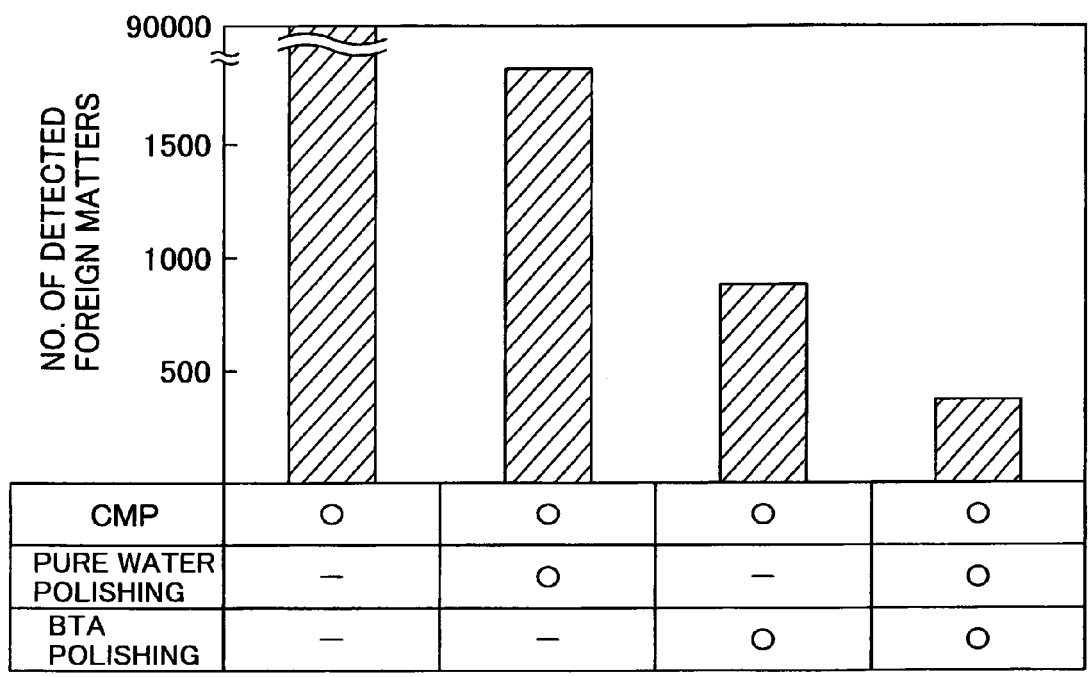
FIG. 4 is a graph showing the numbers of foreign matters resident on the surfaces of substrates subjected to CMP, polishing, washing and cleaning and the like according to the first embodiment, its modifications and a comparative example.

FIG. 4 shows the evaluation results. The ordinate of FIG. 4 represents the number of detected foreign matters. The rightmost bar in FIG. 4 indicates the evaluation result of the substrate processed by the embodiment method. The number of detected foreign matters was 400 or smaller. The leftmost bar in FIG. 4 indicates the evaluation result when the pure water polishing and BTA polishing were not conducted. The second leftmost bar indicates the evaluation result when the BTA polishing was not conducted, and the third leftmost bar indicates the evaluation result when the pure water polishing was not conducted.

When both the pure water polishing and BTA polishing were not conducted, ninety thousand or more foreign matters were detected. When the BTA polishing was not conducted, about one thousand and eight hundred foreign matters were detected. When the pure water polishing was not conducted and the BTA polishing was conducted immediately after CMP, one thousand or less foreign matters were detected.

It can be understood from FIG. 4 that foreign matters can be efficiently removed by performing the pure water polishing and BTA polishing after CMP. It can also be understood that a high foreign matter removal effect can be obtained even omitting the pure water polishing and performing the BTA polishing immediately after CMP.

BTA has the function of terminating dangling bonds (vacancies) on the surface of silicon oxide after polishing. Therefore, foreign matters can be prevented from attaching (bonding) to dangling bonds.

When the substrate 20 attached with foreign matters is brought into contact with BTA aqueous solution, a zeta potential at the surface of the substrate 20, i.e., at the surface of the insulating film 2 of silicon oxide, changes. It can be considered that the foreign matter removal effect is enhanced because the foreign matters become hard to attach the substrate 20 due to a change in the zeta potential. Similar effect can be expected therefore by using chemicals having such an effect in place of BTA aqueous solution. For example, aqueous solution of BTA derivative may be used. Tolyltriazole, BTA carboxylic acid and the like are pointed to as examples of BTA derivative.

In the above embodiment, although abrasive grains contained in slurry are made of silica, similar BTA polishing effect may be expected even if slurry is used which contains alumina ($Al_2O_3$) abrasive grains having a similar zeta potential behavior to that of silica abrasive grains. Similar effect may be expected even if other slurries are used which contain ceria ($CeO_2$) abrasive grains, manganese oxide ($MnO_2$) abrasive grains or zirconia ($ZrO_2$) abrasive grains.

In the above embodiment, the surface of the silicon oxide is exposed after CMP. Similar effect of BTA polishing is expected when insulating material is exposed which has a pH dependency of a zeta potential similar to that of silicon oxide. Such insulating material may be silicon nitride (SiN), silicon oxynitride (SiON), silicon carbooxide (SiOC), silicon carbonitride (SiCN) or the like.

In the above embodiment, the reason why the foreign matter removal effect can be enhanced by pure water polishing prior to BTA polishing, may be ascribed to that pure water eliminates slurry from the surface of the substrate 20 (slurry is replaced with pure water). It may be considered that slurry is replaced more efficiently by using pure water than using BTA aqueous solution. Therefore, in the pure water polishing process (Step S2), liquid having a higher slurry replacement effect than BTA aqueous solution to be used by the following BTA polishing process (Step S3) may be used in place of pure water. For example, the pure water polishing process may use BTA aqueous solution or BTA derivative aqueous solution having a weight percentage lower than BTA or BTA derivative aqueous solution to be used in the BTA polishing process.

The weight percentage of BTA aqueous solution used for BTA polishing (Step S3 shown in FIG. 2) is preferably set to 0.001 wt. % or higher. Saturated aqueous solution of BTA may be used.

The foreign matter removal effect is expected to be enhanced by using solution which contains interfacial active agent, in place of the BTA polishing process of the embodiment. For example, it is expected to be effective if anionic-base interfacial active agent or nonionic-base interfacial active agent is used. It is generally considered that the anionic-base interfacial active agent changes the zeta potential and the nonionic-base interfacial active agent improves wettablity.

Examples of the anionic-base interfacial active agent are carboxylate salt, sulfonate salt, sulfate ester salt, phosphoric ester salt and the like. An example of carboxylate salt is alkyl ether carboxylate. Examples of sulfonate salt are alkyl benzene sulfonate, alpha olefin sulfonate, dialkyl sulfo succinate, formaldehyde condensate of naphthalene sulfonate, and the like. Examples of sulfate ester salt are alkyl sulfate ester salt, alkyl ether sulfate ester salt and the like.

Examples of nonionic-base interfacial active agent are: an ester type (polyhydric alcohol type) such as glycerol fatty acid ester, sorbitan fatty acid ester and sucrose fatty acid ester; an ether type such as polyoxyethylene alkyl ether, polyoxyethylene alkyl phenyl ether and polyoxyethylene polyoxypropylene glycol; alkyl polyglycolide, and the like.

In the above embodiment, although the pure water polishing and BTA polishing are performed in the state that the substrate 20 is mounted on the CMP apparatus, the substrate 20 may be immersed in pure water and BTA aqueous solution instead of performing the polishing processes.

Figure 5:
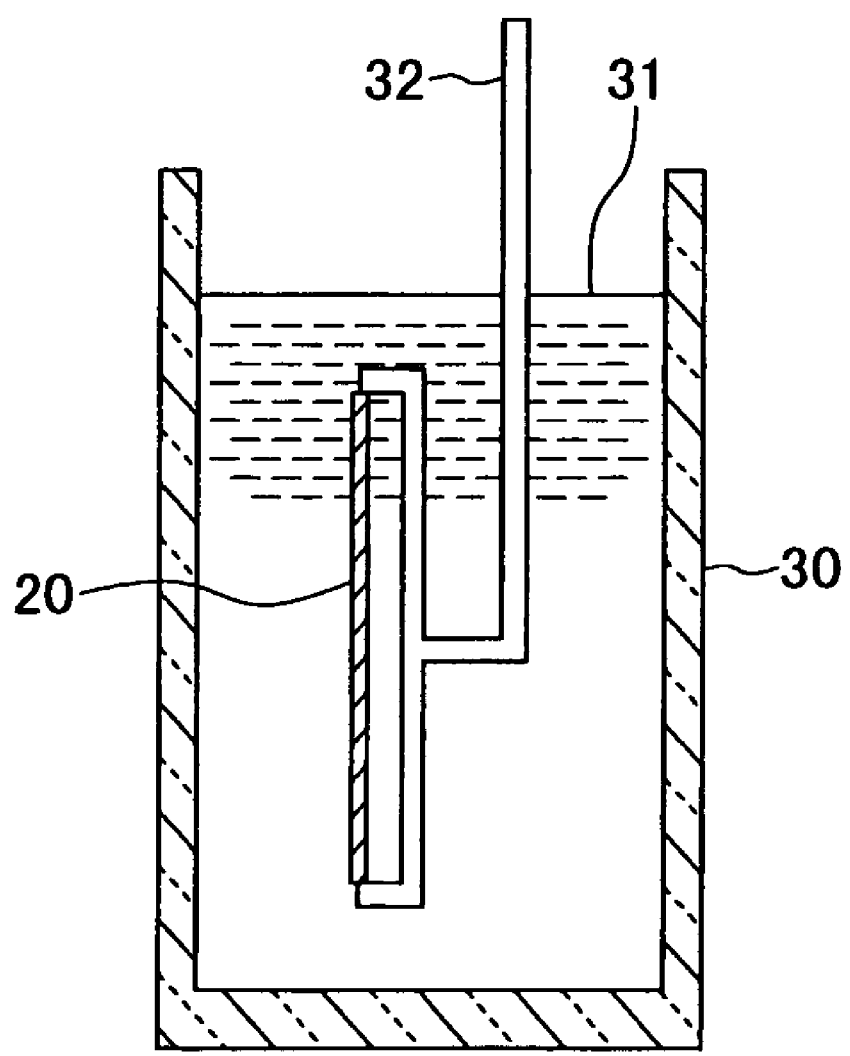
FIG. 5 is a schematic cross sectional view of an apparatus for performing processes after CMP by immersing a substrate to be processed in process solution.

As shown in FIG. 5, process liquid 31 such as pure water and BTA aqueous solution is accommodated in a process vessel 30. A substrate 20 to be processed is held by a wafer carrier 32 and immersed in the process liquid 31. As in the polishing process and immersing process, by exposing the surface of the substrate 20 to pure water and BTA aqueous solution, the foreign matter removal effect can be enhanced.

It is preferable not to dry the surface of the substrate 20 during the period from CMP to pure water polishing and the period from pure water polishing to BTA polishing. This is because if the surface is once dried, it becomes difficult to remove foreign matters.

Next, with reference to FIGS. 6A and 6B, description will be made on a method of manufacturing a semiconductor device according to the second embodiment.

Figure 6A:
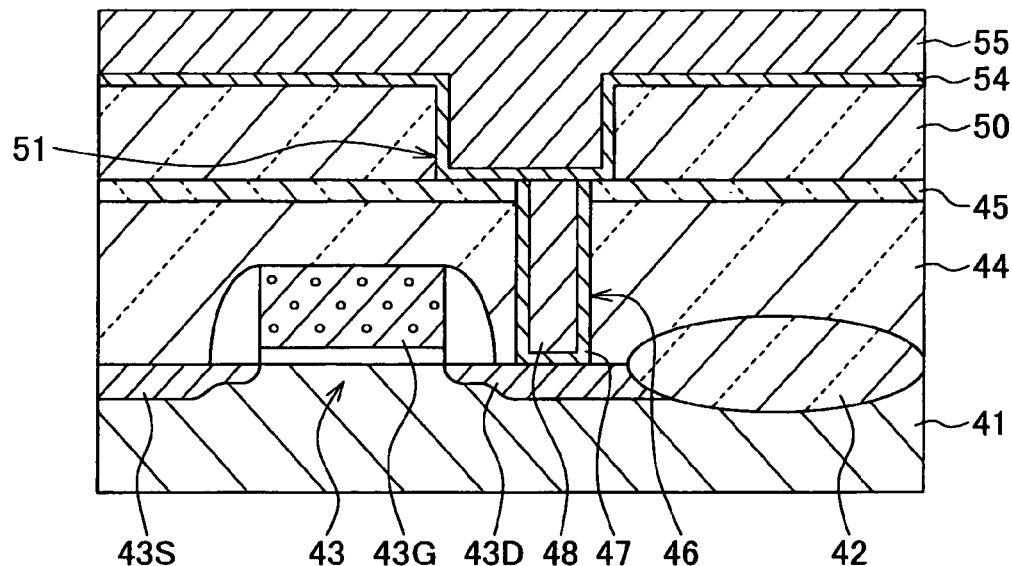
FIGS. 6A and 6B are cross sectional views of a substrate to be processed, illustrating a semiconductor device manufacture method according to a second embodiment.

As shown in FIG. 6A, active regions are defined by isolation regions 42 formed on the surface of a silicon semiconductor substrate 41. In and on the surface layer of the active region, a MOS transistor 43 is formed having a source region 43S, a drain region 43D and a gate electrode 43G.

An interlayer insulating film 44 of silicon oxide ($SiO_2$) is formed on the semiconductor substrate 41, covering the MOS transistor 43. The interlayer insulating film 44 is formed by depositing a silicon oxide film to a thickness of 1.5 μm by chemical vapor deposition (CVD) at a substrate temperature of 600° C. and thereafter planarizing the surface thereof by CMP. After this CMP, the pure water polishing and BTA polishing described with the first embodiment are executed to wash and clean the substrate. In this manner, foreign matters left on the surface can be removed effectively.

A protective film 45 made of silicon nitride and having a thickness of 50 nm is formed on the interlayer insulating film 44. A via hole 46 is formed through the protective film 45 and interlayer insulating film 44, reaching the surface of the drain region 43D. The bottom and side walls of the via hole 46 are covered with a barrier metal layer 47 made of TiN or the like, and a conducive plug 48 of tungsten (W) or the like is filled in the via hole 46.

On the protective film 45, an interlayer insulating film 50 is formed by CVD, being made of silicon oxide and having a thickness of about 100 to 500 nm. A wiring trench 51 is formed through the interlayer insulating film 50, reaching the surface of the protective film 45. The top surface of the conductive plug 48 is exposed on the bottom surface of the wiring trench 51.

A barrier metal layer 54 made of TaN or Ta and having a thickness of 5 to 50 nm is formed by sputtering on the inner wall of the wiring trench 51 and on the upper surface of the interlayer insulating film 50. On the surface of the barrier metal layer 54, a seed layer of copper is formed on the surface of the barrier metal layer 54 by sputtering. By electroplating copper, a metal film 55 made of copper or copper alloy is formed on the seed layer. The inside of the wiring trench 51 is therefore filled in with the metal film 55.

Figure 6B:
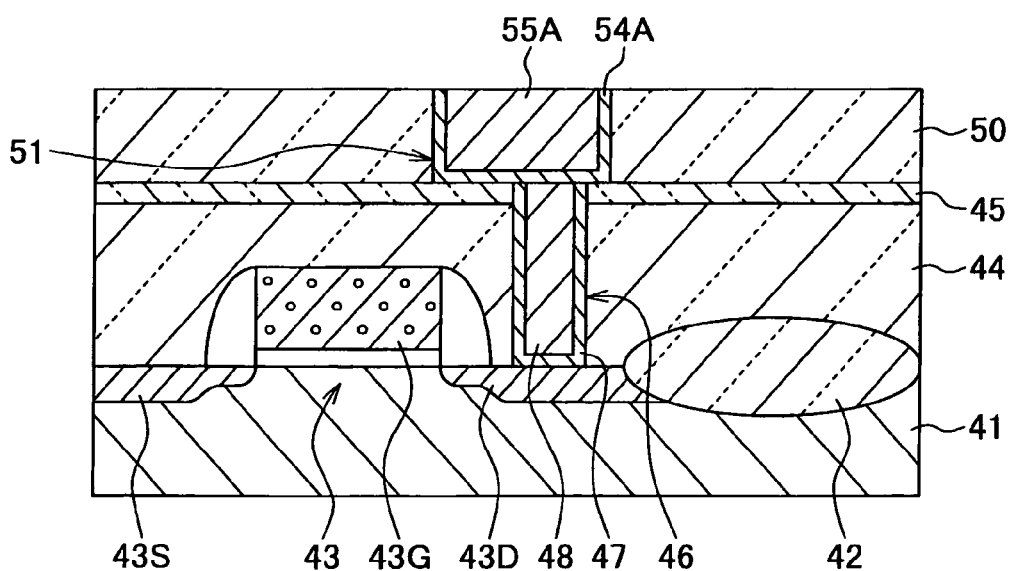

As shown in FIG. 6B, the metal film 55 and barrier metal layer 54 shown in FIG. 6A are subjected to CMP until the interlayer insulating film 50 is exposed. The CMP conditions will be described below.

CMP is performed using general slurry for copper which contains copper anticorrosive, until the barrier metal layer 54 is exposed. For example, slurry may be used which is adjusted to pH of about 8 and contains fumed silica as abrasive grains, hydrogen peroxide as oxidizer, citric acid as organic acid, and BTA as anticorrosive.

After the barrier metal layer 54 is exposed, CMP is performed using slurry not containing copper anticorrosive to remove the barrier metal layer 54 and the surface layer of the metal film 55 left in the wiring trench 51 and expose the interlayer insulating film 50. A barrier metal layer 54A is left on the inner wall of the wiring trench 51, and a main wiring member 55A of copper is left filled in the wiring trench 51. Slurry to be used for this CMP is formed by adding 4.8 wt. % of fumed silica and 0.1 wt. % of citric acid to pure water, adding to this solution 0.16 vol. % of hydrogen peroxide, and adjusting pH by potassium hydroxide. The volume density of hydrogen peroxide represents the value after conversion into undiluted liquid (liquid having a concentration of 100%). pH was adjusted to 9.5 to 9.9 by controlling the additive amount of potassium hydroxide.

After CMP, pure water polishing, BTA polishing, washing and cleaning with alkali washing and cleaning liquid and washing and cleaning with acid washing and cleaning liquid, are sequentially conducted similar to the first embodiment. The interlayer insulating film 50, barrier metal layer 54A and main wiring member 55A are exposed on the surface of the substrate after CMP. In the first embodiment, only the insulating film is exposed on the surface of the substrate after CMP, whereas in the second embodiment, both the insulating film and conductive material are exposed. Also in this case, foreign matters left on the surface can be removed effectively by performing the pure water polishing and BTA polishing.

In the CMP process of the second embodiment, after the barrier metal layer 54 is exposed, the slurry not containing copper anticorrosive is used. In the CMP process using this slurry, both the metal film 55 and barrier metal layer 54 are polished at the same time, and the surface of the insulating film 50 is exposed. In order to planarize the surface after polishing, it is preferable to make small a removal rate difference among the metal film 55, barrier metal layer 54 and insulating film 50. Slurry for copper generally contains anticorrosive in order to prevent corrosion of copper, and its pH is adjusted to 5 to 8. In the pH range from 5 to 8, the removal rate of silicon oxide becomes much faster than that of copper as will be later described. Dishing and erosion are likely to be formed on the surface of copper wiring. If pH is raised in order to increase the removal rate of silicon oxide, it becomes hard to polish copper.

Figure 8A:
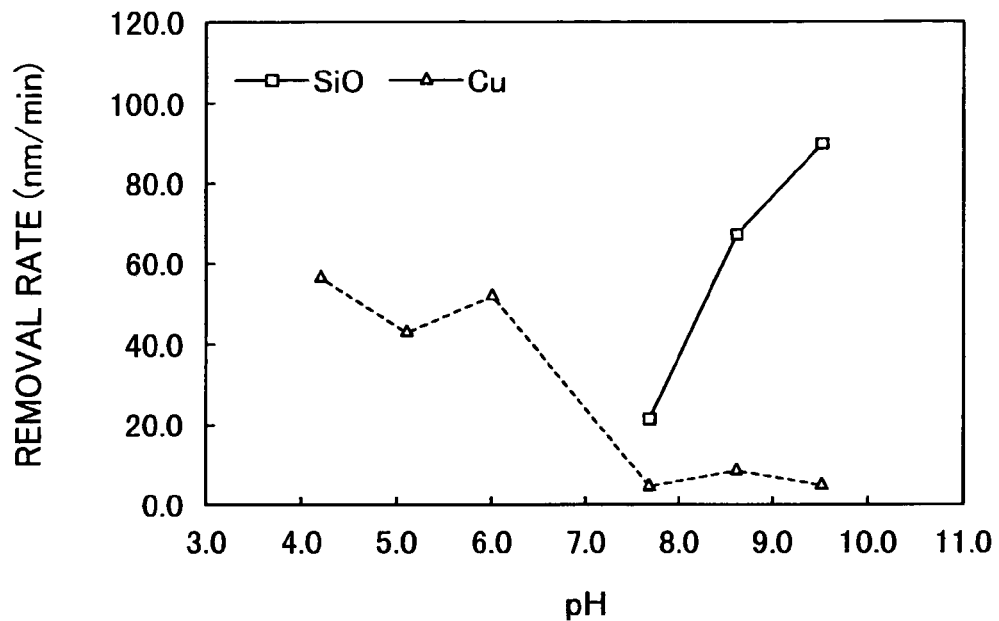
FIG. 8A is a graph showing a pH dependency of a removal rate when slurry which contains anticorrosive is used.

FIG. 8A shows the pH dependency of removal rates of silicon oxide and copper when slurry is used which contains fumed silica at a concentration of 3.5 wt. %, BTA at a concentration of 0.3 wt. %, hydrogen peroxide at a concentration of 0.4 vol. % and potassium hydroxide. The abscissa represents pH and the ordinate represents a removal rate in the unit of "nm/min". Silicon oxide and copper were polished under the same polishing conditions. It can be understood that in the acid range of pH, silicon oxide is scarcely polished. It can also be understood that if pH is raised in order to polish silicon oxide, the removal rate of copper becomes slow.

The present inventors have found that copper can be polished even if pH is raised to about 9 to 10, by adding copper anticorrosive to slurry.

Figure 8B:
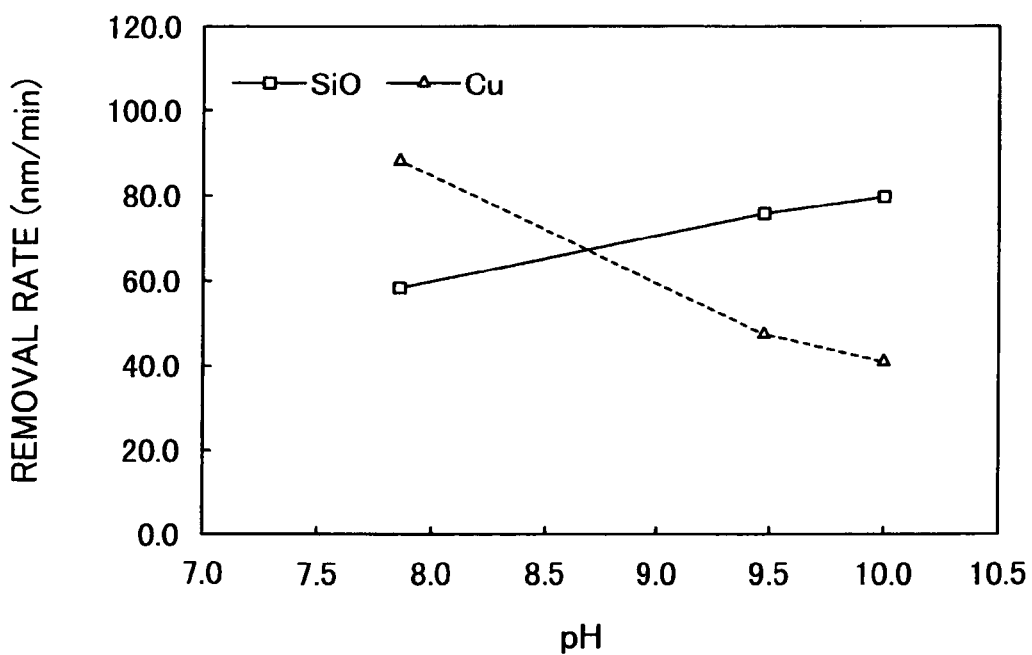
FIG. 8B is a graph showing a pH dependency of a removal rate when slurry which does not contain anticorrosive is used.

FIG. 8B shows the pH dependency of removal rates when slurry is used which contains fumed silica at a concentration of 4.8 wt. %, hydrogen peroxide at a concentration of 0.3 vol. %, citric acid at a concentration of 0.05 wt. % and potassium hydroxide and does not contain anticorrosive. The abscissa and ordinate are similar to those of FIG. 8A. The silicon oxide and copper were polished under the same polishing conditions. As compared to FIG. 8A, it can be understood that the removal rate of about the same degree can be obtained for both silicon oxide and copper.

Anticorrosive added to slurry presents the effect of slowing the removal rate of copper. It can be considered that the removal rate of copper can be increased not by adding anticorrosive. By using the above-described slurry, a polishing difference between silicon oxide and copper can be made small. For example, at pH of 9.56 the removal rates were 56.22 nm/min, 18.57 nm/min and 81.27 nm/min, respectively for copper (Cu), tantalum (Ta) and silicon oxide (P—SiO) formed by PE-CVD. By adjusting the composition ratio among fumed silica, citric acid and hydrogen peroxide, it is possible to set Rs/Rc to a range from 0.8 to 2.2 and Rt/Rc to a range from 0.1 to 1.0 where Rs, Rc and Rt are the removal rates of P—SiO, Cu and Ta, respectively.

If anticorrosive is not added to slurry, there is some fear for corrosion of copper during CMP. However, the experiments made by the present inventors have found no corrosion of copper after CMP using the above described slurry. It can therefore be considered that corrosion of copper is dependent upon the amount of oxygen dissolved in solution in contact with copper. The above-described slurry has the hydrogen peroxide density of 0.16 vol. %. It can be considered that copper corrosion will not occur at the dissolved oxygen amount corresponding to such a density of hydrogen peroxide.

Instead of fumed silica, other abrasive grains may be used such as alumina, ceria, manganese dioxide and zirconia. At an abrasive grain content of 7 wt. %, a number of polishing scratches were formed on the surface after polishing. In order to prevent the formation of polishing scratches on the surface after polishing, it is preferable to set the abrasive grain content to 5 wt. % or smaller. Instead of citric acid, other organic acids may be used. Instead of hydrogen peroxide, other oxidizers may be used. As alkaline additive for pH adjustment, instead of potassium hydroxide, tetramethylammonium hydroxide (TMAH), triethanolamine and the like may be used.

Similar effect is expected also for the case that the insulating surface exposed after polishing is silicon nitride, silicon oxynitride, silicon carbooxide or silicon carbonitride. Similar effect is expected also for the case that the barrier metal layer is made of TaN, Ti, TiN or the like. Although the removal rate varies with material, a preferred composition ratio of slurry can be found through evaluation experiments at different slurry composition ratios.

In the above-described second embodiment, copper wiring is formed, by way of example, through CMP of a copper layer and Ta layer (or TaN layer) filled in the trench (wiring trench 51) formed on the insulating surface. The polishing, and washing and cleaning method of the first embodiment may be applied when a conductive pattern is formed by polishing other conductive materials. For example, when the barrier metal layer 47 and conductive plug 48 are formed, the tungsten layer and TaN layer filled in the via hole 46 are polished until the protective film 45 made of silicon nitride is exposed. After this CMP process, the polishing, washing and cleaning method of the first embodiment may be performed. Similar effect is generally expected also for the case that the material filled in the trench formed on the insulating surface is: metal such as Cu, Ta, W, Ti, Al, Ru, Pt and Ir; alloy which contains these metals; conductive oxide compound of these metals; conductive nitride compound of these metals; conductive carbide of these metals; polysilicon; or amorphous silicon.

Next, with reference to FIGS. 7A and 7B, a semiconductor device manufacture method according to the third embodiment will be described.

Figure 7A:
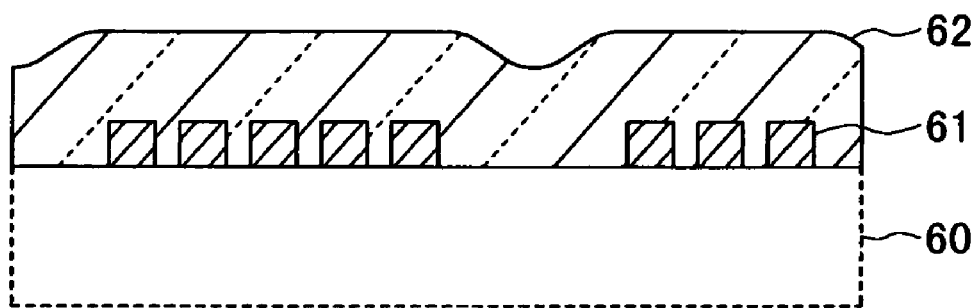
FIGS. 7A and 7B are cross sectional views of a substrate to be processed, illustrating a semiconductor device manufacture method according to a third embodiment.

As shown in FIG. 7A, on the surface of an underlying substrate 60, a wiring pattern 61 is formed made of Al, polysilicon or the like. For example, the underlying substrate 60 is the multi-layer substrate having the stacked layers from the semiconductor substrate 41 to protective film 45 shown in FIG. 6A. An interlayer insulating film 62 is formed on the underlying substrate 60, covering the wiring pattern 61. For example, the interlayer insulating film 62 is made of silicon oxide, silicon nitride, silicon oxynitride, silicon carbooxide or silicon carbonitride. The interlayer insulating film 62 is subjected to CMP to planarize the surface thereof.

Figure 7B:
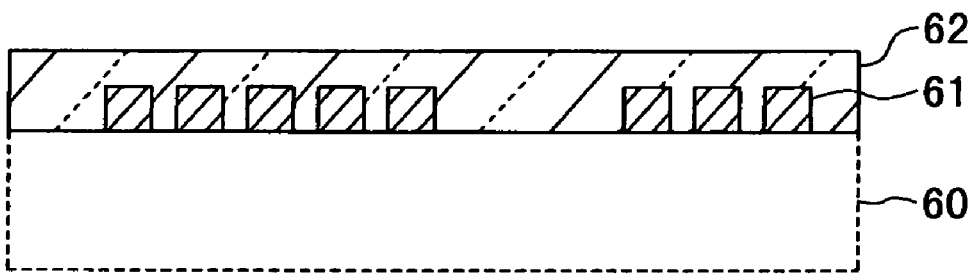

FIG. 7B is a cross sectional view after planarization. Although the surface layer of the interlayer insulating film 62 is removed, the wiring 61 is not exposed but covered with the interlayer insulating film 62 over the whole surface thereof. The CMP conditions are the same as those for the insulating film 2 shown in FIG. 1A. After CMP, the pure water polishing, BTA polishing, washing and cleaning using alkali washing and cleaning liquid, and washing and cleaning using acid washing and cleaning liquid, which are described in the first embodiment, are sequentially performed. With these polishing, and washing and cleaning, foreign matters left on the surface can be removed effectively.

The present invention has been described in connection with the preferred embodiments. The invention is not limited only to the above embodiments. It will be apparent to those skilled in the art that other various modifications, improvements, combinations, and the like can be made.

We claim:

1. A semiconductor device manufacture method, comprising steps of:
   polishing a substrate using chemical mechanical polishing; and
   removing foreign matters left on a polished surface of the substrate in a separate cleaning step after completion of the chemical mechanical polishing of the substrate;
   wherein the step of removing foreign matters include steps of:
   bringing the polished surface of the substrate into contact with first liquid; and bringing the polished surface of the substrate into contact with second liquid after being brought into contact with to the first liquid, and wherein the first liquid is either solution which contains at least one first substance selected from a first group consisting of benzotriazole, derivative of benzotriazole and interfacial active agent, or water, and the second liquid is solution which contains at least one of the first group consisting of benzotriazole, derivative of benzotriazole and interfacial active agent at a weight percentage higher than a weight percentage of the first group in the first liquid.

2. A semiconductor device manufacture method according to claim 1, wherein in the step of bringing into contact with the first liquid, the polished surface of the substrate is polished using the first liquid as polishing liquid under pressure.

3. A semiconductor device manufacture method according to claim 1, wherein in the step of bringing into contact with the second liquid, the polished surface of the substrate is polished using the second liquid as polishing liquid under pressure.

4. A semiconductor device manufacture method according to claim 1, wherein the second liquid contains benzotriazole or benzotriazole derivative at a weight percentage of 0.001 wt. % or more.

5. A semiconductor device manufacture method according to claim 1, wherein the substrate includes an insulating surface occupying a portion of the polished surface and made of second substance selected from a group consisting of silicon oxide, silicon nitride, silicon oxynitride, silicon carbooxide and silicon carbonitride.

6. A semiconductor device manufacture method according to claim 1, wherein the substrate includes a conductive film exposed on the polished surface and made of: metal material selected from a second group consisting of Cu, Ta, W, Ti, Al, Ru, Pt and Ir; alloy which contains one metal material selected from the second group; conductive oxide compound of one metal material selected from the second group; conductive nitride compound of one metal material selected from the second group; conductive carbide compound of one metal material selected from the second group; polysilicon; or amorphous silicon.

7. A semiconductor device manufacture method according to claim 1, wherein after polishing the substrate, the polished surface of the substrate is brought into contact with the first liquid without drying the surface, and after being brought into contact with the first liquid, the polished surface of the substrate is brought into contact with the second liquid without drying the surface.

8. A semiconductor device manufacture method according to claim 1, wherein the first and second liquids are free of abrasives.

* * * * *